(12) United States Patent
Trampitsch (10) Patent No.: US 9,571,052 B1
(45) Date of Patent: Feb. 14, 2017

(54) TRANSCONDUCTANCE (GM) BOOSTING TRANSISTOR ARRANGEMENT

(71) Applicant: LINEAR TECHNOLOGY CORPORATION, Milpitas, CA (US)

(72) Inventor: Gerd Trampitsch, Unterfoehring (DE)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/336,653

(22) Filed: Jul. 21, 2014

(51) Int. Cl.
  *H03F 3/45* (2006.01)
  *H03G 3/04* (2006.01)
  *H03G 3/00* (2006.01)

(52) U.S. Cl.
  CPC .......... *H03G 3/004* (2013.01); *H03F 3/45071* (2013.01); *H03F 2003/45008* (2013.01); *H03F 2200/129* (2013.01); *H03F 2203/45336* (2013.01); *H03F 2203/45528* (2013.01)

(58) Field of Classification Search
  USPC ................................................ 330/252–261
  See application file for complete search history.

(56) References Cited

U.S. PATENT DOCUMENTS

| 5,136,258 A | 8/1992 | Nicollini et al. |
| 8,030,999 B2 | 10/2011 | Chatterjee et al. |
| 8,604,880 B2 * | 12/2013 | Boor ............... H03F 3/505 330/277 |
| 2015/0061766 A1 * | 3/2015 | Fang et al. .............. 330/254 |

* cited by examiner

*Primary Examiner* — Hieu Nguyen
(74) *Attorney, Agent, or Firm* — McDermott Will & Emery LLP (57) ABSTRACT

A circuit may increase input transconductance. An input stage may include a field effect transistor (FET) that has a gate, source, drain, and body terminal. An amplifier may generate an amplified version of the input voltage received that is applied to the body terminal of the FET. Application of the amplified version to the body terminal of the FET may increase the transconductance of the FET compared to what it would be in the same circuit without the amplified version being applied to the body terminal of the FET.

22 Claims, 8 Drawing Sheets

TRANSCONDUCTANCE (GM) BOOSTING TRANSISTOR ARRANGEMENT

BACKGROUND

Technical Field

This disclosure relates to increasing the input transconductance of an amplifier.

Description of Related Art

Transconductance (gm) boosting may be used to increase the input transconductance of an amplifier for achieving higher bandwidths. Several ways are described in literature. However, they may add noise, increase power consumption, and/or limit input voltage range.

SUMMARY

A circuit may increase input transconductance. An input stage may receive an input voltage from an input. The input stage may include a field effect transistor (FET) that has a gate, source, drain, and body terminal. An amplifier may generate an amplified version of the input voltage that is applied to the body terminal of the FET. Application of the amplified version of the input voltage to the body terminal of the FET may increase the transconductance of the FET compared to what it would be in the same circuit without the amplified version being applied to the body terminal of the FET.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Input stages of amplifiers may be built using a differential pair formed by two transistors (e.g. NMOS transistors). The input transconductance (gm) may be given by the gm of the input devices. The bulk-transconductance (gmb) of NMOS transistors is usually five times smaller and therefore may not be used for gm-generation.

Figure 1A:
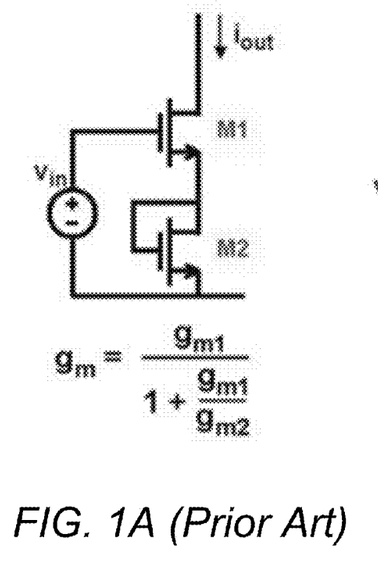
FIG. 1A illustrates an example of a prior art transconductance amplifier for a single input signal and an equation that calculates the input transconductance of this amplifier.
Figure 1B:
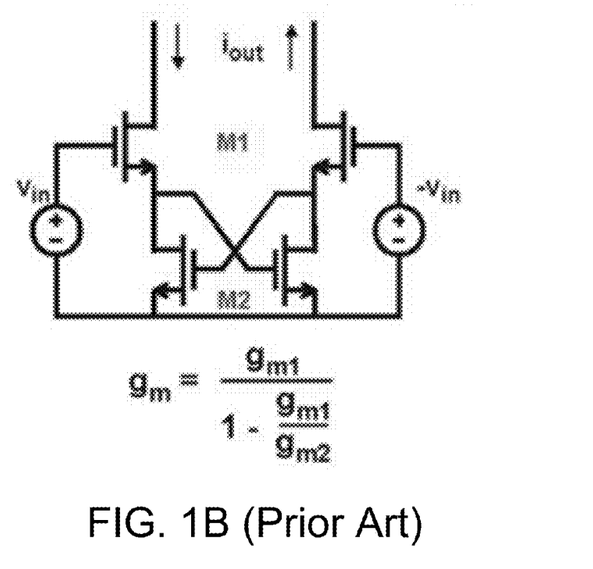
FIG. 1B illustrates an example of a prior art transconductance amplifier for differential input signals with added circuitry that increases input transconductance and an equation that calculates the input transconductance of this amplifier.

FIG. 1A illustrates an example of a prior art transconductance amplifier for a single input signal and an equation that calculates the input transconductance of this amplifier. FIG. 1B illustrates an example of a prior art transconductance amplifier for differential input signals with added circuitry that increases input transconductance and an equation that calculates the input transconductance of this amplifier.

The input voltage range of the amplifier illustrated in FIG. 1B may be limited by one more threshold voltage due to the diode connection of the lower transistor pair. The input referred noise may be larger than for a traditional differential pair due to the diode connected, cross-coupled transistors that can add flicker and thermal noise. Transistors may also be connected to the sources of the input pair and may also increase input referred noise. The circuit may also be susceptible to lock up due to the latch structure of transistor pair M2. If gm1=gm2, the effective input gm may be infinite. So, for stable operation, the gm of either M1 or M2 may need to be reduced.

Figure 2A:
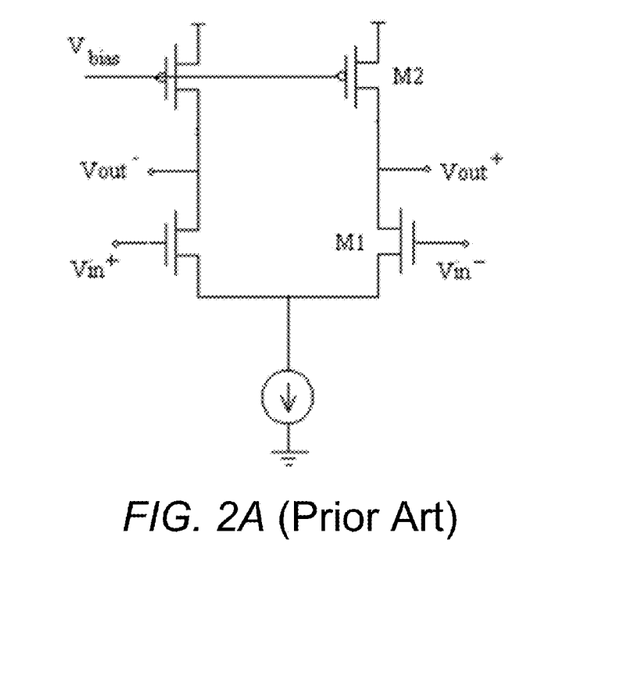
FIG. 2A illustrates an example of a prior art transconductance amplifier for differential input signals.
Figure 2B:
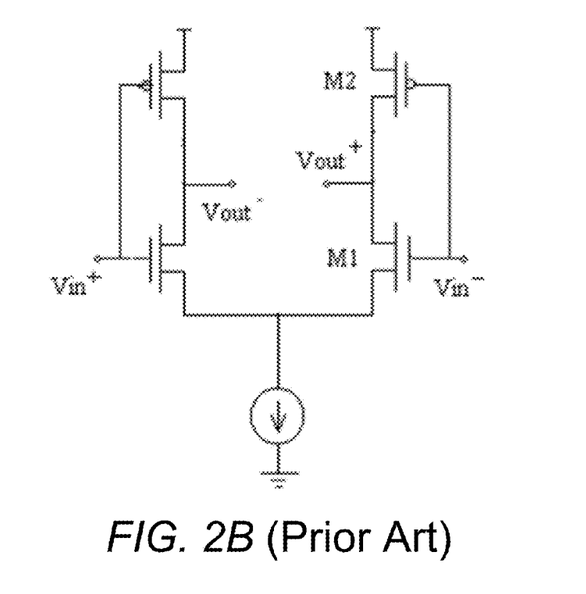
FIG. 2B illustrates an example of an enhanced prior art transconductance amplifier for differential input signals.

FIG. 2A illustrates an example of a prior art transconductance amplifier for differential input signals. FIG. 2B illustrates an example of an enhanced gm prior art transconductance amplifier for differential input signals.

FIG. 2A uses a traditional telescopic amplifier without gm boosting. The circuit depicted in FIG. 2B uses an inverter/current reuse configuration for increasing the input referred transconductance. Both PMOS and NMOS transistors may contribute gm without extra current. The stacked PMOS transistor may limit the input voltage range. It may also not be power efficient when used as input stage for a folded cascode amplifier and may reduce the output voltage range.

Figure 3:
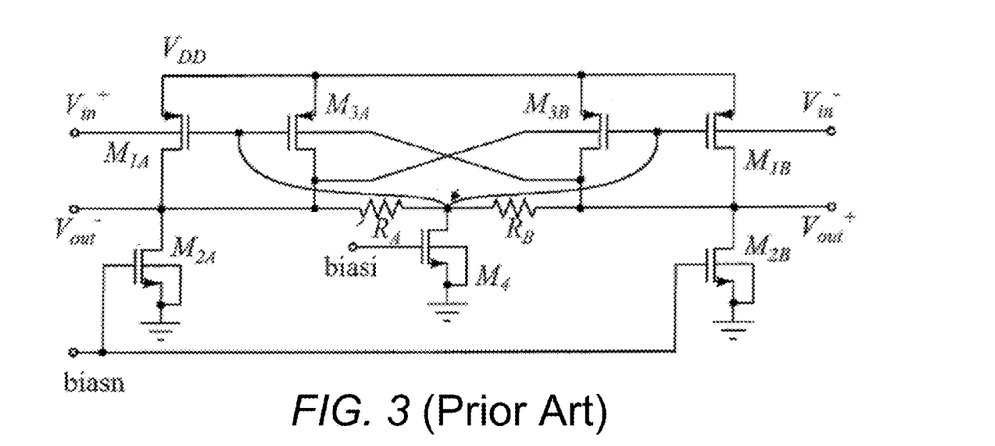
FIG. 3 illustrates an example of an operational transconductance amplifier (OTA) with a bulk input.

FIG. 3 illustrates an example of an operational transconductance amplifier (OTA) with a bulk input. It is taken from U.S. Pat. No. 8,030,999. The low voltage OTA is built with bulk-driven input devices. There is no differential signal applied to the gates of transistors M3A and M3B. Therefore, the achieved effective gm may be low and not a function of gm and gmb. The direct connection of resistances RA and RB may further decrease the transconductance by shunting Vout− to Vout+. The circuits described below may achieve higher effective gm because gm and gmb*A contribute. This may be achieved by applying a differential input signal to the gates of the input transistors and applying an amplified version of the input signal to the bodies of the input FETs. The circuits described below may avoid the direct connection via resistors to the inverted signal path which may result in higher effective transconductance.

Figure 4:
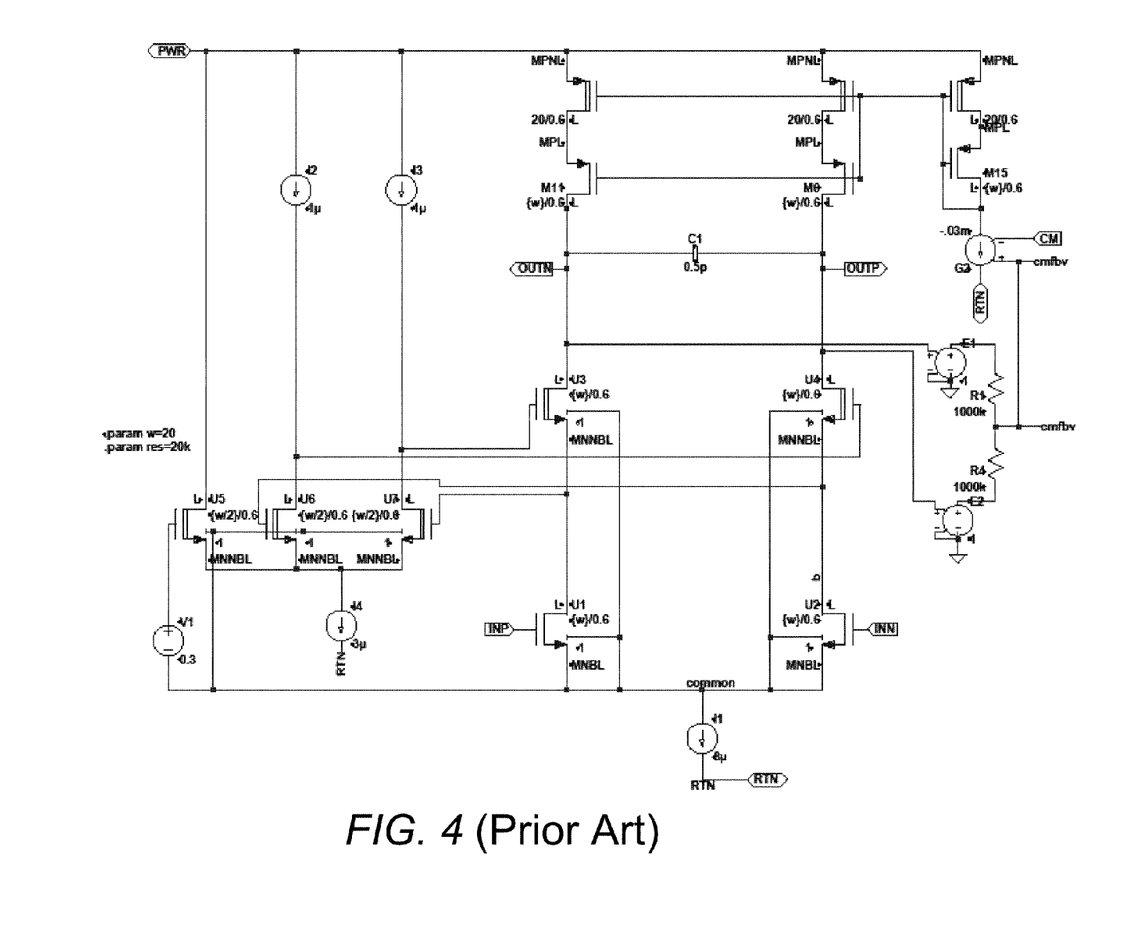
FIG. 4 illustrates an example of a prior art telescopic amplifier with an NMOS input differential pair with gain boosting.

FIG. 4 illustrates an example of a prior art telescopic amplifier with an NMOS input differential pair U1 and U2 for processing a differential input at INP and INN, respectfully, and gain boosting for an NMOS cascode. Common mode feedback may be done through PMOS current sources. Some elements are replaced by ideal components for simplicity.

The differential pair formed by U1 and U2 may generate gm.

The open loop gain ($A_{OL}$) and gain bandwidth product (GBW) of the amplifier may be:

$$A_{OL} = gm * R_{OUT}$$
$$GBW \sim \frac{gm}{C}$$

U3 and U4 may function as cascode transistors for U1 and U2, respectively. Their output impedance may be boosted by the amplifier built with U5, U6, U7, I4, I2 and I3. The bulk terminals of U1, U2, U3 and U4 may be connected to node common or gnd.

OUTN and OUTP may provide a differential output of the amplifier. CM may define the DC output level. Cmfbv may be representative of a common mode feedback voltage. E1 and E2 may function as voltage buffers.

Figure 5:
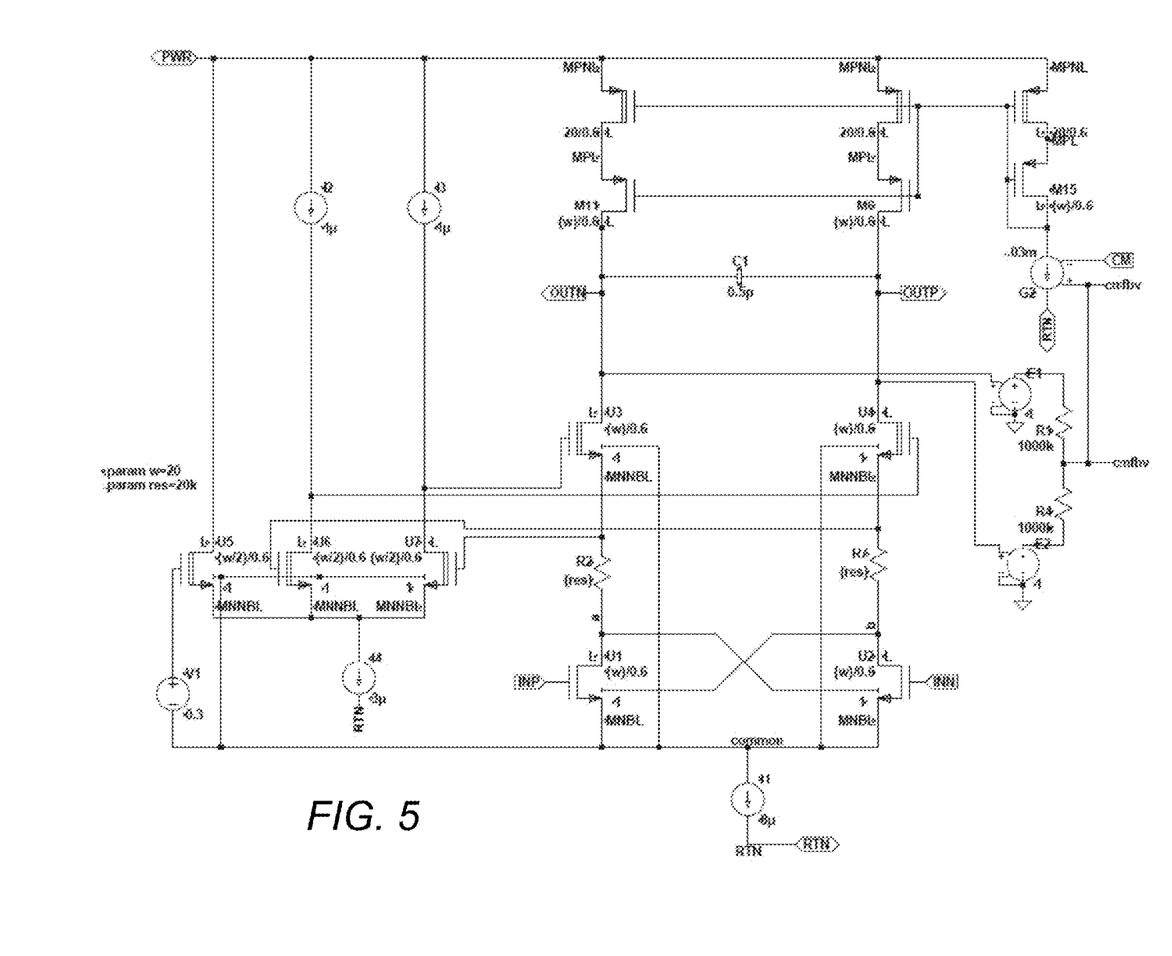
FIG. 5 illustrates an example of a gmb-boosted amplifier with an NMOS input differential pair and a gain boosting amplifier.

FIG. 5 illustrates an example of a gmb-boosted amplifier with an NMOS input differential pair. Transistors U3 and U4 are cascode transistors and may increase the output impedance of the input differential pair formed by U1 and U2. R2 is connected between the drain of U1 and the source of U3. R7 is connected between the drain of U2 and source of U4. The gain-boosting amplifier built by U5, U6, U7, I4, I2 and I3 may establishe a virtual connection between the upper sides of the resistors. The virtual connection between the two resistors may make sure that there is no current flowing between the two output branches of the differential pair. A direct connection instead of the virtual connection may decrease the effective transconductance of the differential pair. The common mode feedback may be done through PMOS current sources. Some elements in the figure are replaced by ideal components for simplicity.

The bulk/body transconductance (gmb) may be:

$$gmb = \frac{dI_D}{dV_{SB}} = \eta * gm, \text{ where } \eta = \frac{\gamma}{2\sqrt{|2\Phi_F| + V_{SB}}},$$

$V_{SB}$ ... bulk source voltage,
γ ... bulk threshold parameter, and
$2\phi_F$ ... surface potential at strong inversion.
Gmb may be 5 times smaller than gm:

$$gmb = \eta * gm \sim 0.2gm$$

The differential pair formed by U1 and U2 may generate an effective gm, $gm_{eff}$.

The voltage gain from node INP-INM to node A-B ($A_{IN}$) may be determined by gm, gmb, R2, R7, and $A_{IN}$ (positive feedback):

If $$R2 = R7 = R \text{ and } gm \text{ of } U1 = gm \text{ of } U2 = gm:$$
$$|A_{IN}| = gm * R + gmb * R * |A_{IN}|$$
$$|A_{IN}| = \frac{gm * R}{1 - gmb * R}$$
$$gm_{eff} = gm + gmb * |A_{IN}| = gm * (1 + \eta * |A_{IN}|)$$

If:

$$\eta = \frac{1}{|A_{IN}|}$$
$$gm_{eff} = 2 * gm$$
$$A_{OL} = gm_{eff} * R_{OUT} = 2 * gm * R_{OUT}$$
$$GBW \sim \frac{gm_{eff}}{C} = \frac{2 * gm}{C}$$

Noise contribution of R2:
Noise current at the node A (neglecting the positive feedback):

$$I_N^2 = \frac{4kT}{R_2} + 4kT\frac{2}{3}gm = 4kT\left(\frac{1}{R_2} + \frac{2}{3}gm\right)$$

Noise voltage at the node A:

$$V_{N\_out}^2 = I_N^2 * R_2^2$$

Input referred noise:

$$V_{N\_in}^2 = \frac{V_{N\_out}^2}{gm^2 * R_2^2} = 4kT\left(\frac{1}{R_2 * gm^2} + \frac{2}{3}\frac{1}{gm}\right)$$

For R2=125 kΩ and gm=50 μS $$V_{N\_in}^2 = 4kT(3200 + 13333)$$

The input referred noise may largely be dominated by the noise of the input transistor.

Figure 6:
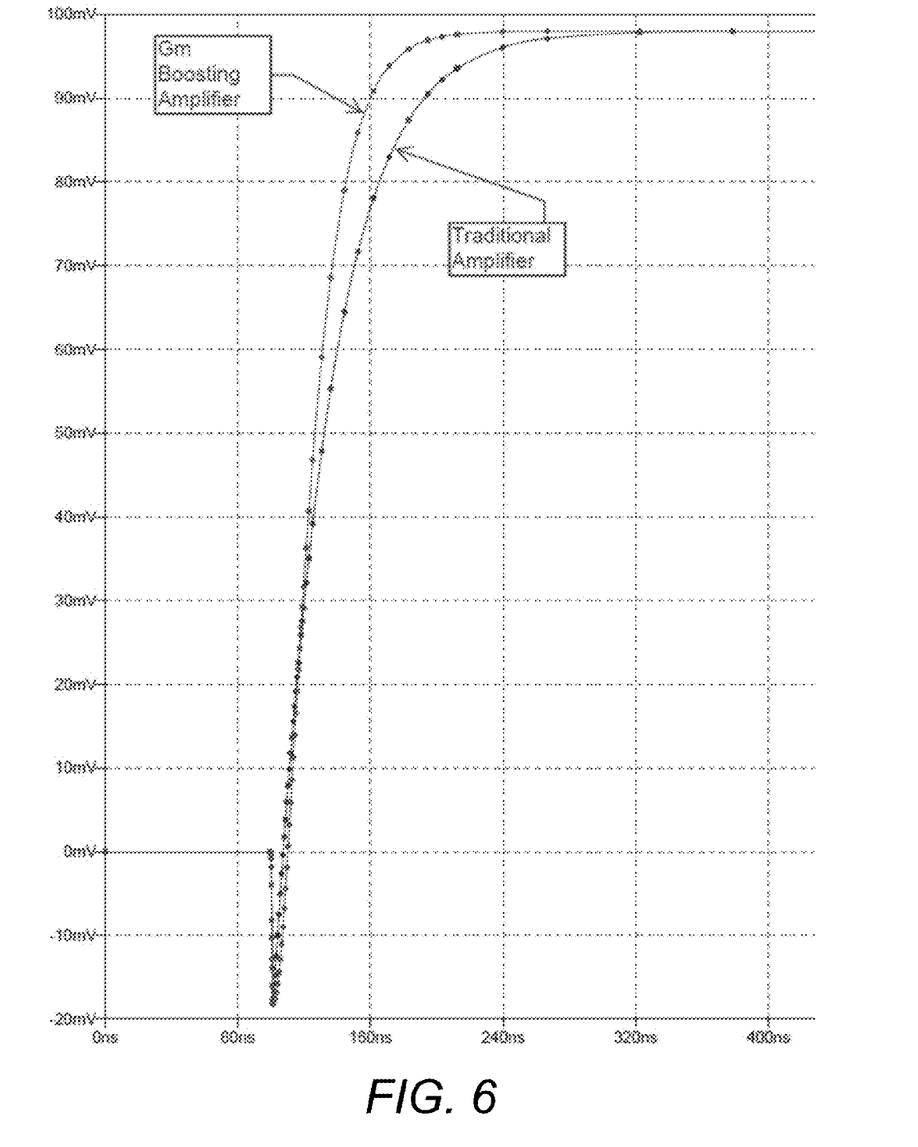
FIG. 6 illustrates an example of a comparison between a step response of a Gmb boosted single stage amplifier and a prior art stage amplifier with the same load capacitance.

FIG. 6 illustrates an example of a comparison between a step response of a Gmb boosted single stage amplifier and a traditional single stage amplifier with the same load capacitance. As can be seen in FIG. 5, the final value of the step response of the gmb boosted amplifier may settle much faster.

Figure 7:
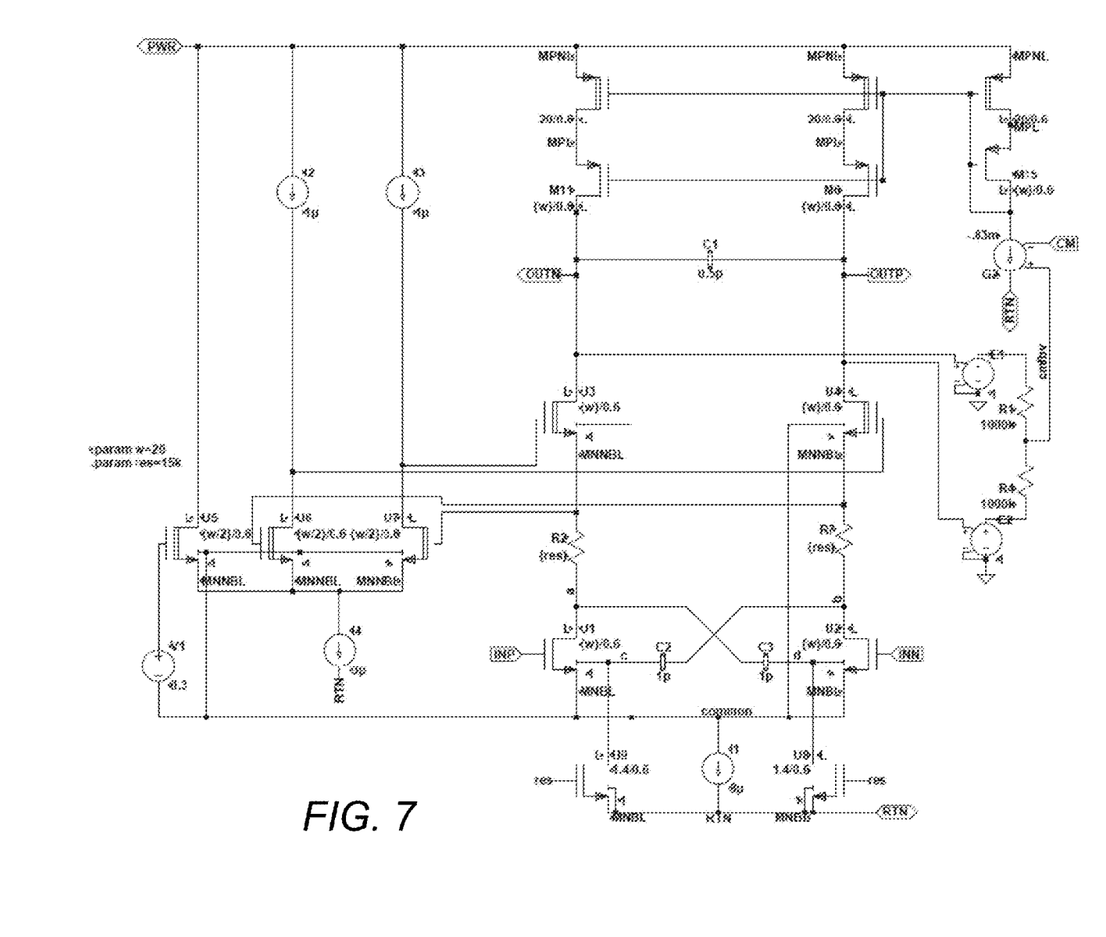
FIG. 7 illustrates an example of a gmb boosted amplifier with an NMOS input differential pair and capacitive cross coupling between their respective body terminals.

FIG. 7 illustrates an example of a gmb boosted amplifier with NMOS input differential pair U1 and U2 and capacitive cross coupling between their respective body terminals. If nodes a or b are more than one diode drop above node common, level shifting may be provided to prevent diodes within the input transistor from opening. This could be done by means of an active circuit or, as illustrated in FIG. 7, by capacitors C2 and C3. Capacitive coupling between the amplified input signal and the bulk nodes of the input devices may not require additional current. The DC voltages at nodes c and d may be refreshed by switches U9 and U8 during a reset phase.

Figure 8:
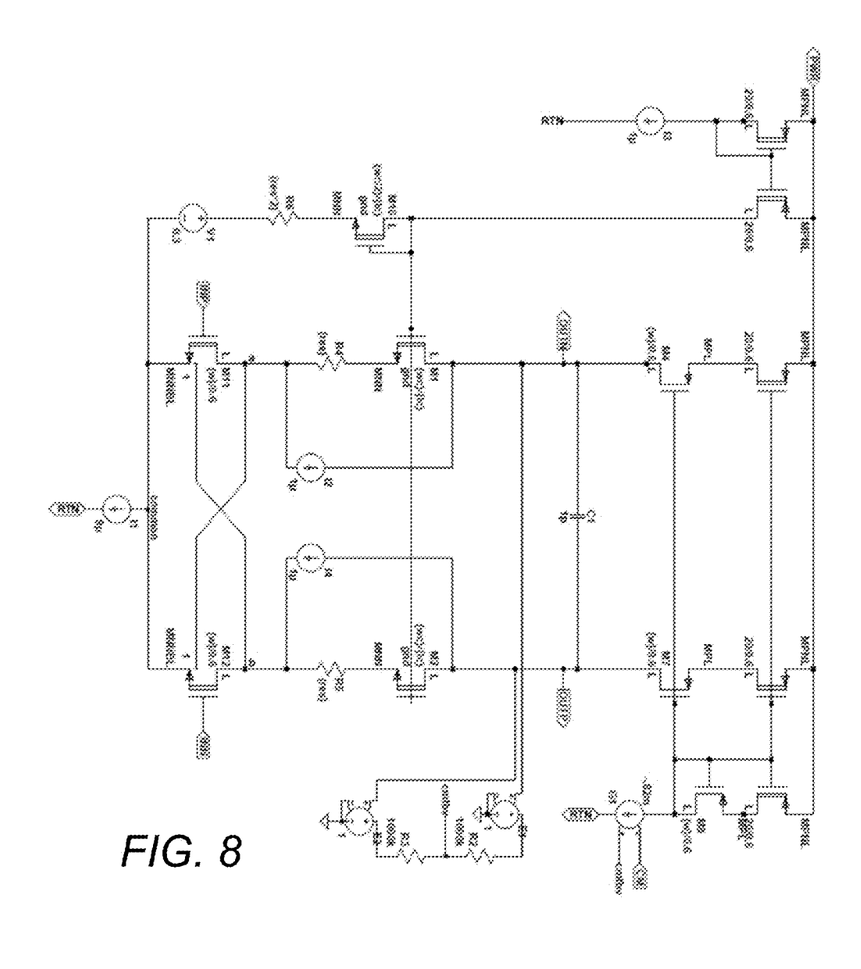
FIG. 8 illustrates an example of a gmb boosted amplifier that connects current sources to amplification nodes for reducing the voltage drop across a resistor or adjusting the gm of cascode transistors.

FIG. 8 illustrates an example of a gmb boosted amplifier that connects current sources I2 and I4 to amplification nodes a and b, respectively, for reducing the voltage drop across the resistor or adjusting the gm of cascode transistors M1 and M2. Current sources I2 and I4 may allow the adjustment of $A_{IN}$ via the current through the cascode transistors M1 & M2. R4 and R5 could be left out and $A_{IN}$ could be set by 1/gm of the cascode transistors. For better reliability, the amplification factor $A_{IN}$ may be adjusted according to PVT (process, voltage and temperature) parameters.

The gmb boosting approaches that have been described may use the bulk transconductance of MOS transistors for increasing the effective gm of a differential pair. The input signal may be amplified with the input transistors of a differential pair. The amplified signals may be cross coupled to bodies of the input transistors for generating a positive feedback. Cross coupling could be done by direct connection, by an active circuit (follower), or by capacitors if level shifting is desired. The amplification may be necessary because the bulk transconductance may be much smaller than the main gm. The described gm boosting technique may dramatically improve the power efficiency of amplifiers as it may add only a negligible amount of noise and may increase bandwidth for a given current.

The gmb boosting approaches that have been described may increase effective transconductance and preserve very low input current of a traditional MOS differential pair. They may amplify an input signal by a factor A. The amplified signal may be cross-coupled between bodies of input devices. The gmb-boosted input stage may significantly increase the effective input transconductance because gm and gmb*A may contribute. The effective input transconductance may be increased with almost no noise penalty, no extra current consumption, and/or no active components.

The gmb boosting approaches that have been described may generate only a little extra noise because they may use gmb for boosting the input referred transconductance and may not require extra transistors. The noise contribution of additional resistors may be mainly thermal noise and may be made negligible by appropriate sizing. Due to increased transconductance in the input stage, noise generated by downstream stages or components may be more suppressed when referred to the input. The same may hold true for input referred offset introduced by following stages/components.

The gmb boosting approaches that have been described are not limited to NMOS differential pairs. They may also be applied to PMOS differential pairs or a combination of NMOS and PMOS, comparable to what is shown in FIG. 1B. The gmb-boosted input stage may be applicable to almost all commonly used amplifier topologies (e.g. telescopic, multi stage, current mirror, folded cascode amplifiers . . . etc.). They can be applied to many other analog circuits like comparators, oscillators or low power/low noise circuits.

The gmb boosting approaches that have been described may be used as an input stage for many different amplifier topologies and may have only little impact on the allowable input voltage range, as compared to a traditional differential pair.

The gmb boosting approaches that have been described may also be used in amplifiers of only a single input signal.

Figure 9:
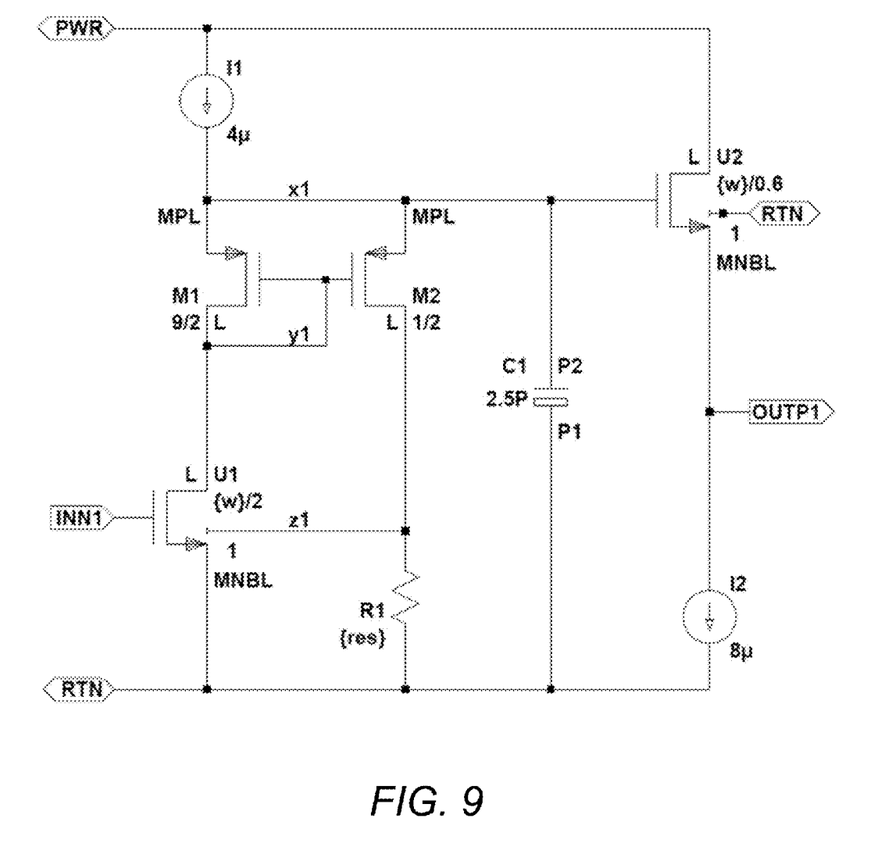
FIG. 9 illustrates an example of a gmb boosted amplifier that has only a single input signal.

FIG. 9 illustrates an example of a gmb boosted amplifier that has only a single input signal. The current mirror formed by M1 and M2 may mirror a portion of the current through the input device U1 to resistor R1 and generate a non-inverted amplified input signal at node z1. Connecting z1 to the body connection of the input device may increase its effective input transconductance. The sum of the current through R1 and U1 may be set by current source I1. Transistor U2 and current source I2 may form a voltage follower for isolating the high impedance node x1. C1 may be the compensation capacitor.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A circuit for increasing input transconductance comprising:
   an input that receives an input voltage;
   an input stage that receives the input voltage from the input, the input stage including a field effect transistor (FET) that is directly connected to the input voltage and that has a gate, source, drain, and body terminal; and
   an amplifier that has an input connected to the input voltage and that generates an amplified version of the input voltage received at the input that is applied to the body terminal of the FET,
   wherein application of the amplified version to the body terminal of the FET increases the transconductance of the FET compared to what it would be in the same circuit without the amplified version being applied to the body terminal of the FET.

2. The circuit of claim 1 wherein the amplifier includes the FET.

3. The circuit of claim 2 further comprising a resistance connected to the body of the FET.

4. The circuit of claim 3 wherein the gain of the amplifier is proportional to the resistance.

5. The circuit of claim 1 wherein the amplifier generates a non-inverted amplified version of the input voltage.

6. The circuit of claim 1 wherein the amplified version of the input voltage is applied to the body terminal of the FET directly.

7. The circuit of claim 1 wherein the amplified version of the input voltage is applied to the body terminal of the FET through a capacitance.

8. The circuit of claim 7 further comprising a DC bias generation circuit that sets the DC operating point of the body terminal.

9. The circuit of claim 1 further comprising a cascode transistor that increases the output resistance of the input stage.

10. The circuit of claim 9 further comprising an auxiliary amplifier that boosts the output resistance of the cascode transistor.

11. The circuit of claim 1 wherein:
    the input receives a differential input voltage;
    the input stage receives the differential input voltage from the input and includes a differential pair of FET transistors, each of which has a gate, source, drain, and body terminal; and
    the amplifier generates an amplified version of the differential input voltage received at the input that is applied to the body terminal of each of the FETs.

12. The circuit of claim 11 wherein the amplifier generates a differential amplified version of the differential input voltage, one component of which is applied to the body terminal of one of the FETs, the other component of which is applied to the body terminal of the other FET.

13. The circuit of claim 12 wherein the amplifier includes the FET transistors.

14. The circuit of claim 13 further comprising a resistance connected to the drain of each FET.

15. The circuit of claim 14 wherein:
    the gain of the amplifier that generates one component of the differential amplified version of the differential input voltage that is applied to the body terminal of one FET is proportional to the resistance that is connected to the drain of that FET; and
    the gain of the amplifier that generates the other component of the differential amplified version of the differential input voltage that is applied to the body terminal of the other FET is proportional to the resistance that is connected to the drain of that other FET.

16. The circuit of claim 11 wherein the amplifier generates a non-inverted amplified version of each component of the differential input voltage.

17. The circuit of claim 13 wherein:
    the differential input voltage has a positive and a negative component;
    one of the FETs in the input stage amplifies the positive component of the input voltage;
    the other FET in the input stage amplifies the negative component of the input voltage;
    the differential amplified version of the positive component is delivered to the body of the FET that amplifies the negative component of the input voltage; and
    the differential amplified version of the negative component is delivered to the body of the FET that amplifies the positive component of the input voltage.

18. The circuit of claim 17 wherein:
    the amplified version of the positive component is delivered directly to the body of the FET that amplifies the negative component of the input voltage; and
    the amplified version of the negative component is delivered directly to the body of the FET that amplifies the positive component of the input voltage.

19. The circuit of claim 17 wherein:
    the amplified version of the positive component is delivered through a capacitance to the body of the FET that amplifies the negative component of the input voltage; and
    the amplified version of the negative component is delivered through a capacitance to the body of the FET that amplifies the positive component of the input voltage.

20. The circuit of claim 19 further comprising a DC bias generation circuit that sets the DC operating point of the body terminal of each FET.

21. The circuit of claim 11 further comprising a cascode transistor that increases the output resistance of the input stage.

22. The circuit of claim 21 further comprising an auxiliary amplifier that boosts the output resistance of the cascode transistor.

* * * * *